United States Patent
Yue et al.

(10) Patent No.: US 9,608,628 B2
(45) Date of Patent: Mar. 28, 2017

(54) CAPACITIVE TOUCH PANEL WITH IMPROVED VISIBILITY

(75) Inventors: Seong-Hoon Yue, Seongnam-si (KR); Yong-Bae Jung, Ulsan (KR); In-Sook Kim, Gyeonggi-do (KR); Min-Hee Lee, CheonGunpo-si (KR); Jung Cho, Seoul (KR)

(73) Assignee: LG HAUSYS, LTD., Seoul (KR)

( * ) Notice: Subject to any disclaimer, the term of this patent is extended or adjusted under 35 U.S.C. 154(b) by 278 days.

(21) Appl. No.: 13/982,473

(22) PCT Filed: Jul. 4, 2012

(86) PCT No.: PCT/KR2012/005294
§ 371 (c)(1),
(2), (4) Date: Jul. 29, 2013

(87) PCT Pub. No.: WO2013/005979
PCT Pub. Date: Jan. 10, 2013

(65) Prior Publication Data
US 2013/0306461 A1    Nov. 21, 2013

(30) Foreign Application Priority Data

Jul. 4, 2011 (KR) .................. 10-2011-0066139

(51) Int. Cl.
*G06F 3/045* (2006.01)
*H03K 17/96* (2006.01)
*G06F 3/044* (2006.01)

(52) U.S. Cl.
CPC ........... *H03K 17/962* (2013.01); *G06F 3/044* (2013.01); *G06F 2203/04103* (2013.01); *Y10T 156/10* (2015.01)

(58) Field of Classification Search
CPC .......... G06F 3/044; G06F 2203/04103; H03K 17/962

(Continued)

(56) References Cited

U.S. PATENT DOCUMENTS

| 2004/0119701 A1 | 6/2004 | Mulligan et al. |
| 2010/0060596 A1 | 3/2010 | Whight |

(Continued)

FOREIGN PATENT DOCUMENTS

| JP | 2005070821 A | 3/2005 |
| JP | 2008098169 A | 4/2008 |

(Continued)

OTHER PUBLICATIONS

KR101066111B1 translation—(original Sep. 2011).*

(Continued)

*Primary Examiner* — Renee Luebke
*Assistant Examiner* — Lheiren Mae A Caroc
(74) *Attorney, Agent, or Firm* — Hauptman Ham, LLP

(57) ABSTRACT

The present invention provides a capacitive touch panel and a manufacturing method thereof, wherein the capacitive touch panel includes a first transparent substrate in which an upper transparent electrode and an upper metal interconnect electrode are formed on the lower side thereof; a transparent adhesive portion; and a second transparent substrate in which a lower transparent electrode and a lower metal interconnect electrode are formed on the upper side thereof. More specifically, the invention provides a capacitive touch panel with excellent visibility since an expensive ITO transparent electrode is replaced with conductive materials such as CNT and graphene and the touch panel has an electrode pattern of a specific structure.

4 Claims, 5 Drawing Sheets

(a)

(b)

(58) Field of Classification Search
USPC .......................................... 200/600; 345/174
See application file for complete search history.

(56) References Cited

U.S. PATENT DOCUMENTS

| | | |
|---|---|---|
| 2010/0245285 A1 | 9/2010 | Wang et al. |
| 2011/0090172 A1* | 4/2011 | Kaya et al. .................... 345/174 |
| 2011/0109583 A1 | 5/2011 | Lee |
| 2011/0234530 A1* | 9/2011 | Kim et al. .................... 345/174 |
| 2012/0062478 A1* | 3/2012 | Kim ........................ G06F 3/045 |
| | | 345/173 |

FOREIGN PATENT DOCUMENTS

| | | | |
|---|---|---|---|
| JP | 2009271918 A | 11/2009 | |
| JP | 2010176571 A | 8/2010 | |
| JP | 2010282729 A | 12/2010 | |
| KR | 10-2005-0084370 A | 8/2005 | |
| KR | 10-2009-0115048 A | 11/2009 | |
| KR | 10-2010-0082514 A | 7/2010 | |
| KR | 20100082514 A * | 7/2010 | ................... 345/174 |
| KR | 10-2010-0095988 A | 9/2010 | |
| WO | 2011078170 A1 | 6/2011 | |

OTHER PUBLICATIONS

Japanese Office Action dated Jul. 1, 2014.
Japanese Notice of Allowance dated Jan. 20, 2015.
International Search Report mailed Dec. 21, 2012 for PCT/KR2012/005294.

* cited by examiner

Example

Comparative example

CAPACITIVE TOUCH PANEL WITH IMPROVED VISIBILITY

CROSS REFERENCE TO RELATED APPLICATION

This application claims the priority of Korean Patent Application No. 10-2011-0066139, filed on Jul. 4, 2011 in the KIPO (Korean Intellectual Property Office). Further, this application is the National Phase Application of International Application No. PCT/KR2012/005294 filed Jul. 4, 2012, which designates the United States and was published in Korean. Both of the priority documents are hereby incorporated by reference in their entireties.

TECHNICAL FIELD

The present invention relates to a capacitive touch panel, and more particularly, to a capacitive touch panel which employs a patterned transparent electrode coated with a conductive composition to improve visibility.

BACKGROUND ART

A conventional capacitive touch panel using an ITO transparent electrode has problems of poor visibility due to overlap between a sensing pattern on an upper side and an operation pattern on a lower side. Further, although an upper metal-interconnect electrode and a lower metal-interconnect electrode are arranged in a parallel form to reduce resistance, excessive increase in fraction of a parallel circuit reduces total resistance and thus can deteriorate touch sensitivity. Moreover, if the ITO transparent electrode is replaced with CNT or graphene, such problems become more serious and visibility thereof may also be deteriorated due to inherent properties of such materials.

Therefore, there is a need for an electrode pattern structure which employs a conductive material such as CNT or graphene as a replacement for an ITO transparent electrode while securing high visibility.

DISCLOSURE

Technical Problem

It is an aspect of the present invention to provide a capacitive touch panel which employs a conductive material such as CNT or graphene as a replacement for an expensive ITO transparent electrode and has an electrode pattern of a particular structure, thereby providing high visibility.

Technical Solution

In accordance with one aspect of the present invention, a capacitive touch panel includes: a first transparent substrate having an upper transparent electrode and an upper metal-interconnect electrode on a lower surface thereof; a transparent adhesive portion; and a second transparent substrate having a lower transparent electrode and a lower metal-interconnect electrode on an upper surface thereof, wherein the lower transparent electrode includes a conductive composition.

In accordance with another aspect of the present invention, a method of manufacturing a capacitive touch panel includes: forming an upper transparent electrode and an upper metal-interconnect electrode on a lower surface of a first transparent substrate; forming a lower transparent electrode and a lower metal-interconnect electrode on an upper surface of a second transparent substrate; and bonding the first transparent substrate and the second transparent substrate, wherein the lower transparent electrode includes a conductive composition.

Advantageous Effects

The capacitive touch panel of the invention uses a relatively inexpensive conductive material compared to an ITO transparent electrode and has an electrode pattern with a specific structure, thereby having high visibility as well as cost competitiveness.

Further, according to the manufacturing method of the invention, a capacitive touch panel having a transparent electrode with high impact resistance and low total resistance can be manufactured.

DESCRIPTION OF DRAWINGS

FIGS. 2 (a) and (b) show patterns of upper transparent electrodes 120 according to one embodiment of the present invention.

FIGS. 3 (a) and (b) show patterns of lower transparent electrodes 140 according to one embodiment of the present invention.

FIGS. 4 (a) and (b) show an overlapping shape of the upper transparent electrode 120 and the lower transparent electrode 140 according to the embodiment of the present invention.

BEST MODE

The above and other aspects, features, and advantages of the present invention will become apparent from the detailed description of the following embodiments in conjunction with the accompanying drawings. It should be understood that the present invention is not limited to the following embodiments and may be embodied in different ways, and that the embodiments are provided for complete disclosure and thorough understanding of the present invention by those skilled in the art. The scope of the present invention is defined only by the claims. Like components will be denoted by like reference numerals throughout the specification.

Hereinafter, a capacitive touch panel according to embodiments of the invention will be described in more detail with reference to the accompanying drawings.

Figure 1:
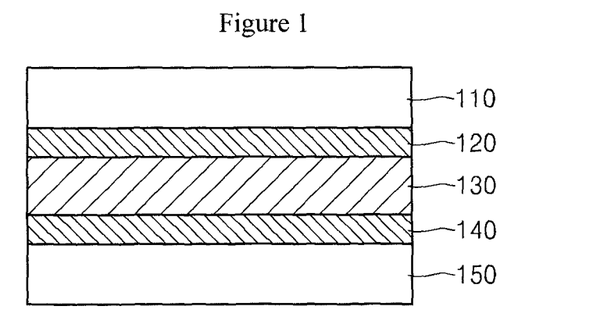
FIG. 1 is a cross-sectional view of a capacitive touch panel according to one embodiment of the present invention.

FIG. 1 is a cross-sectional view of a capacitive touch panel according to one embodiment of the present invention.

The capacitive touch panel includes a first transparent substrate 110 having an upper transparent electrode 120 and an upper metal-interconnect electrode on a lower surface thereof; a transparent adhesive portion 130; and a second transparent substrate 150 having a lower transparent electrode 140 and a lower metal-interconnect electrode on an upper surface thereof. Here, the lower transparent electrode may include a conductive composition.

The first or second transparent substrate 110 or 150 includes at least one of glass, polyethylene terephthalate (PET), polyethylene naphthalate (PEN), polyimide (PI), and acryl.

The glass is tempered glass which is produced by heating formed plate glass at a temperature of 500° C. to 600° C. that is close to a softening point thereof, and quenching the plate glass using compressed cool air to compress a surface of the glass and apply tensile strain to the inside thereof. The tempered glass has high bending strength that is 3 to 5 times the bending strength of common glass, high impact resistance that is 3 to 8 times the impact resistance of common glass, and improved heat resistance. Thus, the tempered glass can contribute to improvement in durability of a touch panel.

In the case where both first and second transparent substrates 110, 150 are formed of glass, the substrates can resist high temperature in application of the upper and lower transparent electrodes 120, 140 thereto, whereby low resistance transparent electrodes can be obtained.

The first or second transparent substrate 110 or 150 may be formed of polyethylene terephthalate (PET).

A PET film is biaxially oriented and thus has various advantages in terms of heat resistance and manufacturing cost.

When the PET film is used to form the first or second transparent substrate 110 or 150, the PET film is prepared at about 100° C.

Although other materials such as PEN, PI, acryl and the like may be used to prepare the first or second transparent substrate 110 or 150, it is desirable in terms of operational stability, dimensional stability, anti-precipitation of impurities, and the like that both the first and second transparent substrates 110, 150 be formed of glass.

The upper transparent electrode 120 may include indium tin oxide (ITO) or a conductive polymer. The transparent electrode refers to a thin film electrode, the first and second transparent substrates 110, 150 of which are transparent and have conductivity. That is, the transparent electrode is a transparent conductive film that may include ITO or alternatives such as a conductive polymer or conductive particles. Examples of the conductive polymer may include polyacetylene, polypyrrole, polyaniline, and polythiophene.

In the present invention, the low transparent electrode 140 may include a conductive composition. In this invention, the conductive composition may include carbon nanotubes (CNTs) or graphene. Such substances are advantageous due to relative inexpensiveness and high conductivity as compared with ITO.

The transparent adhesive portion 130 is disposed between the first and second transparent substrates 110, 150 to bond the first substrate 110 to the second transparent substrate 150. Since the capacitive touch panel 100 employs the transparent adhesive portion 130, an air interlayer is not created in the capacitive touch panel 100 as in a resistance film-type touch panel, and the capacitive touch panel 100 has significantly reduced interface reflectance and does not suffer glare or non-uniformity due to interference. The transparent adhesive portion 130 may be formed of an optically clear adhesive (OCA). When an OCA having a high dielectric constant is used, a voltage difference between two electrodes increases, thereby providing a strong electric field.

Figure 2:
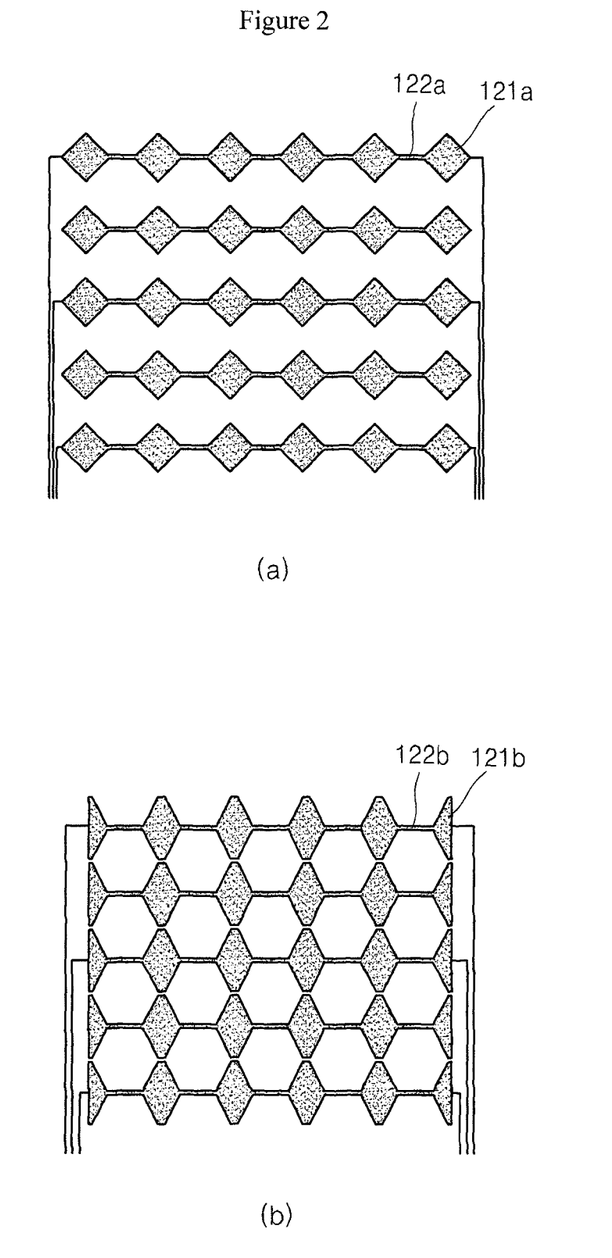

Referring to FIGS. 2 (a) and (b), the upper transparent electrode 120 includes rhombic patterns 121a, 121b, and upper connectors 122a, 122b disposed between the rhombic patterns to connect the rhombic patterns. The lower transparent electrode 140 includes polygonal patterns 141a, 141b, and lower connectors 142a, 142b disposed between the polygonal patterns to connect the polygonal patterns.

Figure 3:
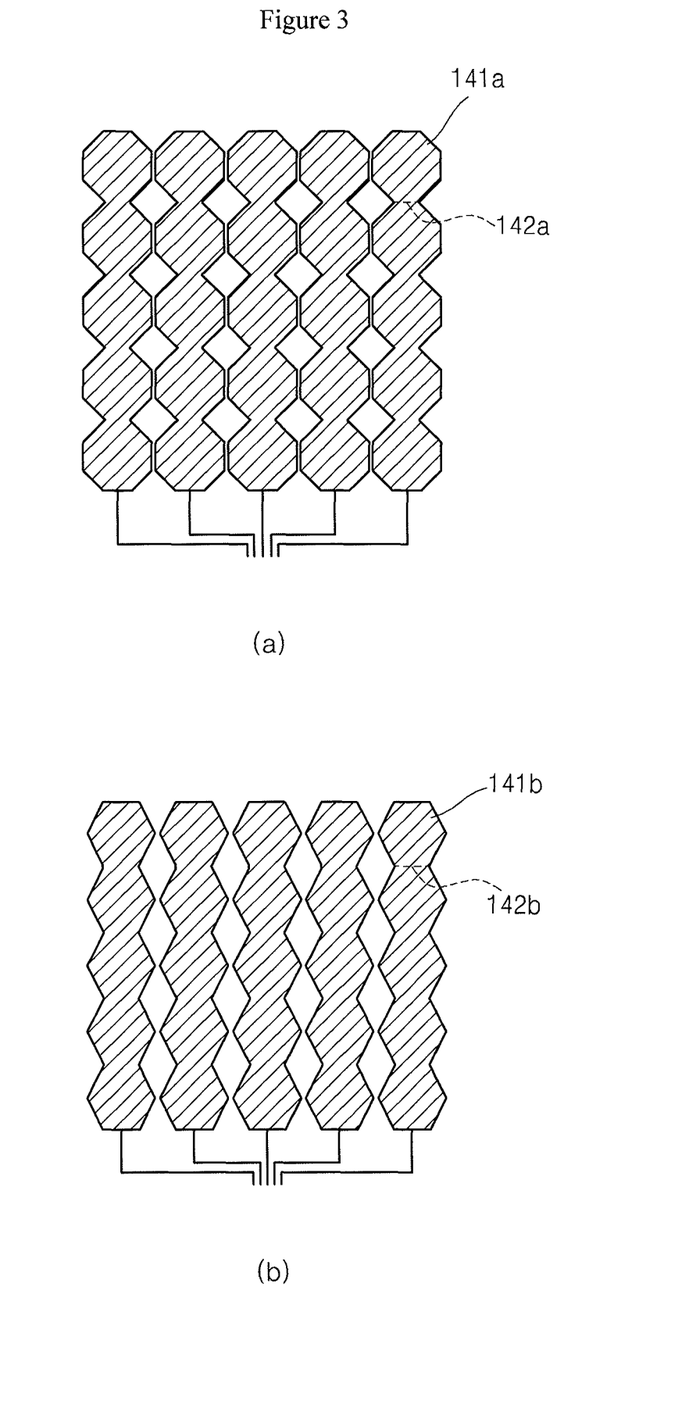

The upper transparent electrode 120 is formed in the rhombic patterns 121a, 121b, which are connected to each other by the lower connectors 142a, 142b disposed therebetween. In addition, referring to FIGS. 3 (a) and (b), the lower transparent electrode 140 is formed in polygonal patterns 141a, 141b, which are connected to each other by the lower connectors 142a, 142b disposed therebetween.

The upper connectors 122a, 122b connect the rhombic patterns arranged at constant intervals by connecting, for example, vertices of rhombic shapes to each other. The lower connectors 142a, 142b are common surfaces between adjoining polygonal patterns which are continuously arranged.

The upper transparent electrode 120 is formed by arranging a plurality of rhombic patterns 121a, 121b, each of which is elongated in a longitudinal direction, at regular intervals in the longitudinal direction. Namely, the upper transparent electrode 120 is formed by the rhombic patterns 121a, 121b, which are arranged parallel to each other in the longitudinal direction on a frontal area of the first transparent substrate 110, and are electrically connected to each other by the upper connectors 122a, 122b in the longitudinal direction.

The formation of the rhombic patterns 121a, 121b on the upper transparent electrode 120 may increase density of an electric field emitted from the lower transparent electrode 140.

The lower transparent electrode 140 is formed by continuously arranging a plurality of plurality of polygonal patterns 141a, 141b, each of which is elongated in a transverse direction. Namely, the lower transparent electrode 140 is perpendicular to the upper transparent electrode 120 on an area of the backside of the second transparent substrate 150, and is formed by the polygonal patterns 141a, 141b, which are provided parallel to each other in the transverse direction and electrically connected to each other by the lower connectors 142a, 142b in the transverse direction.

The lower transparent electrode 140 may have various polygonal shapes, such as a triangular shape, rectangular shape, pentagonal shape, hexagonal shape, octagonal shape, and other angled shapes according to design conditions. A diagonal length of the rhombic pattern, which is provided to the upper metal-interconnect electrode of the upper transparent electrode 120, can vary according to the polygonal pattern provided to the lower metal-interconnect electrode of the lower transparent electrode 120.

In the capacitive touch panel of the invention, the upper transparent electrode 120 may have a smaller area than the lower transparent electrode 140. The lower transparent electrode 140 coated with a conductive material is disadvantageous in terms of thickness adjustment, as compared with the upper transparent electrode 120 formed of ITO, and there is a difference in visibility between a surface processed during formation of the lower transparent electrode 140 and an unprocessed surface. Thus, it is desirable that the processed area be as small as possible.

Figure 4:
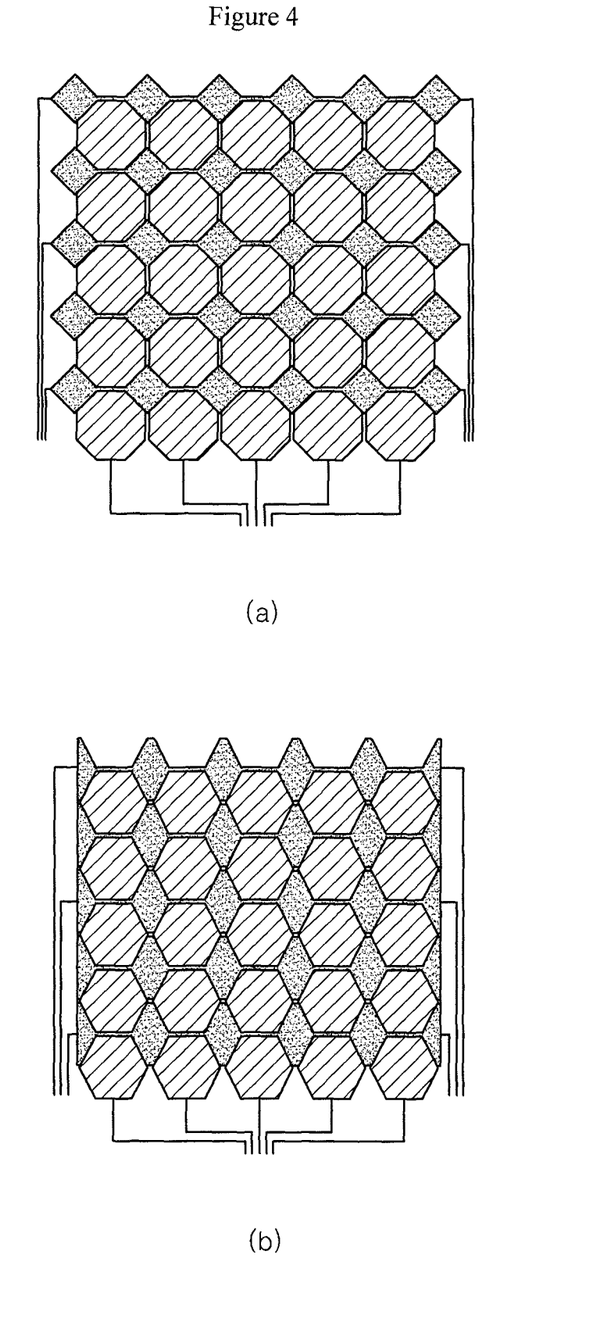

FIG. 4 shows an overlapping shape of the upper transparent electrode 120 and the lower transparent electrode 140 according to the embodiment of the invention. In the present invention, the rhombic patterns 121a, 121b of the upper transparent electrode 140 and the polygonal patterns 141a, 141b of the lower transparent electrode 140 may not overlap each other. However, it is desirable that in such an arrangement, the upper connectors 122a, 122b and the lower connectors 142a, 142b overlap each other such that the upper transparent electrode and the lower transparent electrode are electrically connected to each other. When a crossed area between the upper transparent electrode 120 and the lower transparent electrode 140 is small, a moiré phenomenon that can occur due to simple repetition of continuous identical patterns can be restricted and total resistance can be reduced.

Further, with the electrode patterns as shown in FIG. 4, the lower transparent electrode composed of a conductive composition may also have improved visibility and the electrode patterns may properly cope with touch action at multiple points.

In accordance with another aspect of the present invention, a method of manufacturing a capacitive touch panel includes: forming an upper transparent electrode 120 and an upper metal-interconnect electrode on a lower surface of a first transparent substrate 110; forming a lower transparent electrode 140 and a lower metal-interconnect electrode on an upper surface of a second transparent substrate 150; and bonding the first transparent substrate to the second transparent substrate, wherein the lower transparent electrode includes a conductive composition.

To provide a transparent electrode structure of a touchscreen according to the invention, the upper transparent electrode 120 and the lower transparent electrode 140 are formed on the lower and upper surfaces of the first and second transparent electrodes 110, 150, respectively, by any one of methods including CVD or PECVD, spraying coating, air-jet coating, gravure offset coating, rotary screen coating, and silkscreen coating, which can be properly selected according to the kind of material forming the transparent electrode.

When the upper transparent electrode 120 is formed of an ITO film, plasma discharge sputtering is generally used. In sputtering, high voltage is applied to a film-forming material, that is, a target, in a vacuum created using a vacuum device. Then, an ionized inert gas is formed to collide with a surface of the target, followed by depositing a material, which is removed from the target, onto a substrate, thereby forming a film on the substrate. Sputtering shows excellent performance in terms of widthwise uniformity and stability in long-term processing (in a flowing direction), and thus is suitable for long-term and stable manufacture of wide films.

When the lower transparent electrode 140 is formed of a CNT film or a conductive polymer, the lower transparent electrode 140, which is pre-patterned by air jet printing, spray printing, rotary screen printing, silkscreen printing, or the like, may be placed on the second transparent substrate. Then, the lower transparent electrode having a polygonal pattern may be formed by laser etching. As described above, the lower transparent electrode has as small an etching area as possible.

After the transparent electrodes are formed and patterned on the first and second transparent substrates 110, 150, metal-interconnect electrodes are formed on the first and second transparent substrates 110, 150 over a region excluding a display screen region to minimize resistance of the electrodes. If the metal-interconnect electrode has a wide wiring area as a signal line, an effective area of a display to be used together with a capacitive touch panel can be small. Thus, advantageously, the wire lines have as small a line width as possible.

The upper and lower metal electrodes may be formed by typical roll-to-toll printing or inkjet printing, air jet printing, spray printing, offset printing, gravure offset printing, reverse offset printing, rotary screen printing, and the like. Each of the upper and lower metal-interconnect electrodes may have a thickness of 100 µm or less. The upper and lower metal-interconnect electrodes may be formed by coating or depositing at least one of elemental materials including Cu, Ni, Al, Cr, Mo, Ag and Au.

Roll printing is a method in which a roller rotates along a substrate such that a material adhered to the surface of the roller is transferred to the substrate. Use of such a roll printing method enables elimination of a complex process such as photolithography and can minimize the line width of the metal-interconnect electrode.

In a printing technique such as inkjet printing, air jet printing and spray printing, a conductive ink is sprayed by a nozzle to form a metal interconnect. The printing technique may more precisely form an interconnect electrode in a simple, inexpensive process and with minimal consumption of materials. Thus, it is possible to minimize the line width in formation of the metal-interconnect electrode.

The first and second transparent substrates may be bonded together by any method publicly known to those skilled in the art.

The present invention is not limited to the embodiment shown in the accompanying drawings, and should be defined only by the accompanying claims and equivalents thereof. It will be understood by those skilled in the art that various modifications, changes, alterations and equivalent embodiments can be made without departing from the scope of the present invention.

EXAMPLE

A first transparent substrate, which includes an upper transparent electrode with upper rhombic patterns 121a and an upper metal-interconnect electrode formed by silkscreen printing, and a second transparent substrate, which includes a lower transparent electrode with lower polygonal patterns 141a and a lower metal-interconnect electrode formed by silkscreen printing, were prepared. Then, with the upper transparent electrode and the lower transparent electrode bonded to each other via an OCA (acryl type), a capacitive touch panel was prepared using a vacuum laminator (Model No. LM S 110×150, NPC).

Comparative Example

A capacitive touch panel was manufactured in the same manner as in the example except that a lower transparent electrode had rhombic patterns 121a.

Experimental Example

Evaluation of Visibility of Capacitive Touch Panels

Each of capacitive touch panels prepared in the example and the comparative example was cut to specimens having a size of 10×10 (width×height), which in turn were evaluated as to transmittance of sunlight at an overlapping area and a non-overlapping area between the upper and lower transparent electrodes using a UV-VIS spectral transmittance tester (Shimadzu Co., Ltd.).

Here, visibility was evaluated as follows. In measurement of the transmittance of sunlight at the overlapping area and the non-overlapping area between the upper and lower transparent electrodes, a difference of less than 0.5% was evaluated to be high visibility, and a difference of 0.5% or more was evaluated to be low visibility.

Further, resistance linearity (uniformity) was measured for the example and the comparative example using a resistance tester (available from VITRON Co., Ltd.). Specifically, capacitive touch panels of the example and comparative example were manufactured in a longitudinal direction and a difference (ΔE) in voltage variation depending on distance was obtained when a DC voltage of 5 V was applied across both ends of the modules.

Here, an electric field was created towards the lower transparent electrode due to impact (touch) of the upper transparent electrode. It was evaluated such that the transparent electrode pattern had good performance when it could easily perceive impact strength. That is, a perception rate for an impact position was evaluated to be good, when a voltage change with respect to a distance from the impact position is small and linearity by voltage increases.

TABLE 1

| ΔE | 10 mm | 20 mm | 30 mm | 40 mm | 50 mm | Average |
|---|---|---|---|---|---|---|
| Ex. | 1.0 | 1.3 | 1.2 | 1.0 | 1.3 | 1.16 |
| Com. Ex. | 1.1 | 1.5 | 1.1 | 1.5 | 1.1 | 1.26 |

Figure 5:
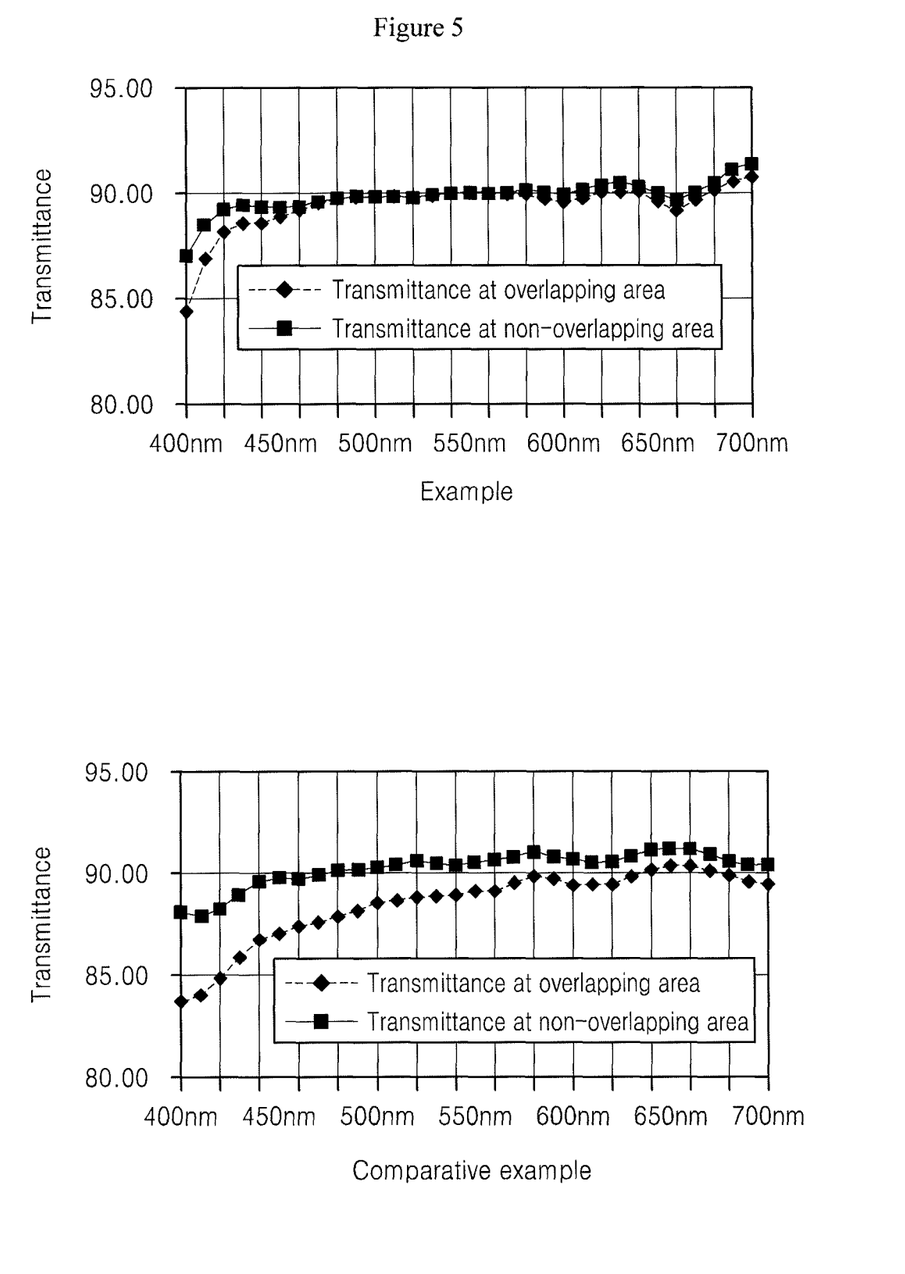
FIG. 5 shows a graph of spectral transmittance depending on wavelength according to an inventive example and a comparative example.

Referring to Table 1, in the example, when measuring spectral transmittance at a wavelength of 550 nm, a difference in transmittance of sunlight at the overlapping area and the non-overlapping area between the upper and lower transparent electrodes was less than 0.5%. On the contrary, in the comparative example, the transmittance was reduced at the overlapping area between the upper and lower transparent electrodes. Specifically, a difference in transmittance at the overlapping area and the non-overlapping area between the upper and lower transparent electrodes at a wavelength of 550 nm was 3%.

As a result, it could be seen that the example, in which the upper transparent has a smaller area than the lower transparent electrode, and the rhombic patterns of the upper transparent electrode and the polygonal patterns of the lower transparent electrode did not overlap each other, had higher visibility than the comparative example in which the upper and lower transparent electrodes have the same patterns.

Further, as a result of checking a final average value of differences in a voltage change according to distance with reference to Table 1, the example had a smaller difference in voltage change according to distance than the comparative example. Thus, it could be seen that the example had a good perception rate at an impact position and provided excellent precision for perceived position.

Therefore, it could be seen that the patterns of the example, in which the upper transparent electrode had a smaller area than the lower transparent electrode, had better performance than the comparative example, in which the upper transparent electrode had the same area as the lower transparent electrode.

the invention claimed is:

1. A capacitive touch panel comprising:
   a first transparent substrate having an upper transparent electrode and an upper metal-interconnect electrode on a lower surface thereof;
   a transparent adhesive portion; and
   a second transparent substrate having a lower transparent electrode and a lower metal-interconnect electrode on an upper surface thereof,
   wherein the lower transparent electrode comprises a conductive composition,
   wherein the upper transparent electrode consists of indium tin oxide (ITO), and the lower transparent electrode consists of carbon nanotubes (CNTs) or graphene,
   wherein the upper transparent electrode comprises rhombic patterns and upper connectors disposed between the rhombic patterns to connect the rhombic patterns,
   wherein the lower transparent electrode comprises octagonal patterns and lower connectors disposed between the octagonal patterns to connect the octagonal patterns, and each octagonal pattern shares a common sidewall with at least one adjacent octagonal pattern,
   wherein the lower connectors are the common sidewalls between adjoining octagonal patterns which are continuously arranged,
   wherein each rhombic pattern of the upper transparent electrode has a smaller area than each octagonal pattern of the lower transparent electrode, and
   wherein the rhombic patterns of the upper transparent electrode and the octagonal patterns of the lower transparent electrode do not overlap each other.

2. The capacitive touch panel according to claim 1, wherein the first or second transparent substrate comprises at least one of glass, polyethylene terephthalate (PET), polyethylene naphthalate (PEN), polyimide (PI), and acryl.

3. A method of manufacturing a capacitive touch panel, the method comprising:
   forming an upper transparent electrode and an upper metal-interconnect electrode on a lower surface of a first transparent substrate; forming a lower transparent electrode and a lower metal-interconnect electrode on an upper surface of a second transparent substrate; and
   bonding the first transparent substrate to the second transparent substrate,
   wherein the lower transparent electrode comprises a conductive composition, the upper transparent electrode comprises indium tin oxide (ITO), and the lower transparent electrode comprises carbon nanotubes (CNTs) or graphene,
   wherein the upper transparent electrode and the lower transparent electrode are formed on the lower and upper surfaces of the first and second transparent electrodes, respectively, by one method selected from the group consisting of spraying coating, air-jet coating, and rotary screen coating,
   wherein the upper transparent electrode is formed comprising rhombic patterns and upper connectors disposed between the rhombic patterns to connect the rhombic patterns, the lower transparent electrode is formed comprising octagonal patterns and lower connectors disposed between the octagonal patterns to connect the octagonal patterns, and each octagonal pattern shares a common sidewall with at least one adjacent octagonal pattern,
   wherein the lower connectors are the common sidewalls between adjoining octagonal patterns which are continuously arranged,
   wherein each rhombic pattern of the upper transparent electrode is formed having a smaller area than each octagonal pattern of the lower transparent electrode, and
   wherein the rhombic patterns of the upper transparent electrode and the octagonal patterns of the lower transparent electrode do not overlap each other.

4. The method according to claim 3, wherein the first or second transparent substrate comprises at least one of glass, polyethylene terephthalate (PET), polyethylene naphthalate (PEN), polyimide (PI), and acryl.

* * * * *